(12) United States Patent
Soer et al.

(10) Patent No.: US 9,890,911 B2
(45) Date of Patent: Feb. 13, 2018

(54) LED MODULE WITH UNIFORM PHOSPHOR ILLUMINATION

(71) Applicant: Koninklijke Philips N.V., Eindhoven (NL)

(72) Inventors: Wouter Anthon Soer, San Jose, CA (US); Hendrik Johannes Boudewijn Jagt, San Jose, CA (US); Olexandr Valentynovych Vdovin, San Jose, CA (US)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 15/105,120

(22) PCT Filed: Dec. 17, 2014

(86) PCT No.: PCT/IB2014/066996
§ 371 (c)(1),
(2) Date: Jun. 16, 2016

(87) PCT Pub. No.: WO2015/092696
PCT Pub. Date: Jun. 25, 2015

(65) Prior Publication Data
US 2016/0320001 A1    Nov. 3, 2016

Related U.S. Application Data

(60) Provisional application No. 61/917,959, filed on Dec. 19, 2013.

(51) Int. Cl.
*A43B 1/02*    (2006.01)
*F21K 9/62*    (2016.01)
(Continued)

(52) U.S. Cl.
CPC .......... *F21K 9/62* (2016.08); *F21K 9/64* (2016.08); *F21V 5/04* (2013.01); *F21V 7/00* (2013.01);
(Continued)

(58) Field of Classification Search
CPC . F21Y 210/02; F21V 9/16; F21K 9/00; F21K 9/64
(Continued)

(56) References Cited

U.S. PATENT DOCUMENTS

2006/0102914 A1    5/2006  Smits et al.
2006/0208269 A1    9/2006  Kim et al.
(Continued)

FOREIGN PATENT DOCUMENTS

DE    102011078572 A1    1/2013
WO    2012035799 A1    3/2012
(Continued)

OTHER PUBLICATIONS

EPO as ISA, PCT/IB2014/066996, "International Search Report and Written Opinion", dated Apr. 14, 2015, 12 pages.

*Primary Examiner* — Ahshik Kim
(74) *Attorney, Agent, or Firm* — Brian D. Ogonowsky; Patent Law Group LLP

(57) ABSTRACT

The generally Lambertian LED die emission is modified by an optical structure formed over the LED die that reduces the light emission along a normal axis and enhances the light emission at an angle with respect to the normal axis, producing a certain light emission profile. A phosphor layer is provided overlying the optical structure, such as in a reflective light-mixing chamber. The light emission profile results in more uniform flux from the LED die impinging across the surface of the phosphor. Some of the LED light passes through the phosphor and some of the light is
(Continued)

converted to light of a different wavelength. The light emission profile results in more uniform color and temperature across the phosphor. The light emission profile may be created by a lens, a patterned layer over the LED die, a semi-reflective layer over the LED die, an optical sheet, or other technique.

15 Claims, 6 Drawing Sheets

(51) Int. Cl.

| | | |
|---|---|---|
| *F21V 9/16* | (2006.01) | |
| *H01L 25/075* | (2006.01) | |
| *H01L 33/50* | (2010.01) | |
| *H01L 33/58* | (2010.01) | |
| *F21K 9/64* | (2016.01) | |
| *F21V 5/04* | (2006.01) | |
| *F21V 7/00* | (2006.01) | |
| *F21V 13/08* | (2006.01) | |
| *H01L 33/54* | (2010.01) | |
| *H01L 33/60* | (2010.01) | |
| *F21Y 115/10* | (2016.01) | |

(52) U.S. Cl.
CPC ............... *F21V 9/16* (2013.01); *F21V 13/08* (2013.01); *H01L 25/0753* (2013.01); *H01L 33/502* (2013.01); *H01L 33/507* (2013.01); *H01L 33/54* (2013.01); *H01L 33/58* (2013.01); *H01L 33/60* (2013.01); *F21Y 2115/10* (2016.08); *H01L 2924/0002* (2013.01)

(58) Field of Classification Search
USPC .......................................................... 362/84
See application file for complete search history.

(56) References Cited

U.S. PATENT DOCUMENTS

| | | | |
|---|---|---|---|
| 2006/0291238 A1 | 12/2006 | Epstein et al. | |
| 2008/0061310 A1 | 3/2008 | Chiu et al. | |
| 2011/0006331 A1 | 1/2011 | Shaikevitch | |
| 2013/0143339 A1* | 6/2013 | Tischler | H01L 33/50 438/27 |
| 2014/0285995 A1* | 9/2014 | Ray | H01L 33/501 362/84 |
| 2014/0328049 A1* | 11/2014 | Hikmet | F21V 13/02 362/84 |

FOREIGN PATENT DOCUMENTS

| | | |
|---|---|---|
| WO | 2013054226 A1 | 4/2013 |
| WO | 2013088296 A1 | 6/2013 |

\* cited by examiner

LED MODULE WITH UNIFORM PHOSPHOR ILLUMINATION

CROSS-REFERENCE TO RELATED APPLICATIONS

The present application is a 371 application of International Application No. PCT/IB2014/066996 filed on Dec. 17, 2014 and entitled "LED Module with Uniform Phosphor Illumination," which claims the benefit of U.S. Provisional Patent Application Ser. No. 61/917,959 filed on Dec. 19, 2013.

FIELD OF THE INVENTION

This invention relates to lighting devices using light emitting diodes (LEDs) and phosphors and, in particular, to a technique for improving the uniformity of color and flux across a phosphor layer (or other conversion material) overlying the LEDs.

BACKGROUND

FIG. 1 illustrates a conventional LED die 12 having a layer of phosphor 14 overlying and separated from the LED die 12, but proximate to the LED die 12. The LED die 12 includes n-type layers 15, an active layer 16 that emits light, and p-type layers 17. Light exits through the top and side surfaces of the LED die 12. The LED die 12 may emit blue light, and the phosphor 14 may be a YAG phosphor that emits a yellow-green light. The combination of the blue light leaking through the phosphor 14 and the phosphor emission creates white light. The phosphor 14 may be supported by a transparent support surface in close proximity to the LED die 12.

FIG. 2 illustrates the generally Lambertian light emission pattern 18 of the bare LED die 12. When the light impinges on a flat layer of phosphor 14 above the LED die 12, the flux impinging on the phosphor 14 is greatest along the normal axis directly over the center of the LED die 12. The flux drops off with distance from the center point over the LED die 12. In other words, as the angle of the light rays deviates from normal, the flux impinging on the phosphor 14 becomes less. As a result, the light exiting the surface of the phosphor 14 will be bluer directly over the LED die 12 relative to the light further away from the center of the LED die 12.

Additionally, for the same reasons, the temperature of the phosphor 14 will be higher directly over the LED die 12 due to the higher flux. Some phosphors and quantum dots are very sensitive to temperature and change their optical characteristics with temperature. Therefore, the temperature gradient across the phosphor 14 will contribute to the color non-uniformity. Also, at higher temperature locations, the quantum efficiency of the phosphor is reduced as well as the long term material stability.

Additionally, the phosphor directly over the LED die 12 suffers other adverse effects from the high flux, which affects the color directly over the LED die 12.

Accordingly, the color will not be uniform across the surface of the phosphor 14. In some applications, such as when the image of the phosphor-converted LED die 12 is magnified by a parabolic mirror in a projector, headlight, or other secondary optics for a spot application, the color non-uniformity is particularly noticeable.

These problems also exist in LED modules where an array of LED dies is mounted on a common substrate and covered with a layer of phosphor. Above each LED die is an optical and thermal hot spot, where the light is bluer (assuming blue LED dies are used) and where the phosphor is adversely affected by temperature and other factors. As a result, the color and temperature is not uniform across the phosphor.

What is needed is a technique for improving the color uniformity of light across a phosphor surface excited by light from one or more LED dies.

SUMMARY

Various techniques are described that reduce the light emitted along the normal-axis of an LED die and enhance the light emitted off the normal axis, where the resulting light is used to excite a layer of phosphor or quantum dots in close proximity to the LED die. By changing the LED die radiation profile from a Lambertian type to a radiation profile with an off-normal peak intensity, the modified light emission from the LED die will provide more uniform irradiation of the overlying phosphor layer, resulting in more uniform color distribution of emitted light over the phosphor surface and more uniform flux density and temperature across the phosphor.

In one embodiment, a lens is affixed or molded over the LED die to create the desired intensity distribution profile. In another embodiment, a partial reflector layer is formed over the LED die's top surface that allows more light to escape near the edges than in the central area. In another embodiment, a patterned transparent layer is formed over the LED die top surface that reflects and refracts light to create the desired emission pattern. In another embodiment, an optical layer is spaced away from the LED die to create the desired emission pattern.

A phosphor layer (or quantum dot layer) is then provided over the LED die, or array of LED dies. The phosphor layer may be supported by a transparent plate above an array of LED dies in a light-mixing box or self-supporting. The optimal intensity distribution profile of the LED dies is dependent on factors including the pitch of LED dies and the distance between the LED dies and the phosphor layer.

Other embodiments are described.

BRIEF DESCRIPTION OF THE DRAWINGS

Elements that are the same or similar are labeled with the same numeral.

DETAILED DESCRIPTION

Figure 3:
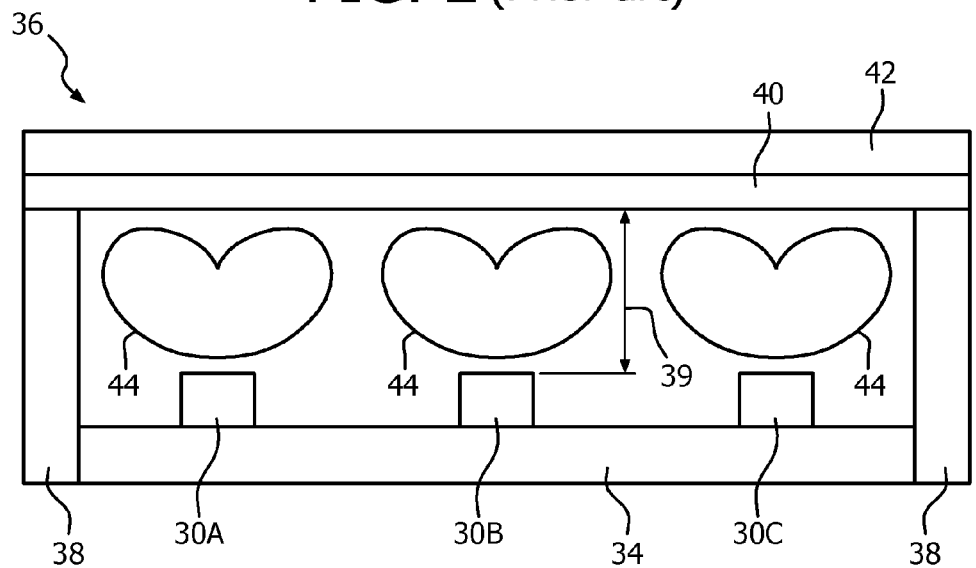
FIG. 3 is a cross-sectional view of a reflective light-mixing box containing LED dies, wherein a phosphor layer is provide above the LED dies, and wherein the LED dies include an optical structure for reducing each die's flux along its normal axis and enhancing the flux at an angle.

FIG. 3 illustrates LED dies 30A, 30B, and 30C (collectively LED dies 30) mounted on a reflective base 34 of a light-mixing box 36. The shape of the light-mixing box 36 can be rectangular, circular, or any other shape. The side walls 38 of the light-mixing box 36 are also reflective, and may be diffuse reflecting or specular reflecting (e.g., coated with a mirror layer) or may have properties of partially diffuse and specular reflectivity. The base 34 may also be diffusively reflective. For diffuse reflecting, the walls 38 and base 34 may be formed of an alumina ceramic material having a high porosity, or coated with a layer containing scattering particles such as metal oxide particles (e.g., titanium dioxide, zirconium oxide, or aluminum oxide).

In another embodiment, the side walls 38 are not reflective but transmissive or diffusively transmissive. The phosphor may conformally cover the walls 38 so that the light exits through the walls 38 and the top of the box 36.

Metal pads (not shown) formed on the base 34 are electrically connected to the respective anode and cathode electrodes of the LED dies 30 for energizing the LED dies 30. The LED dies 30 may be connected in series, in parallel or any suitable combination of series parallel or network. The light-mixing box 36 may be any size, depending on the number of LED dies needed for the required brightness. The area (footprint) of the light-mixing box 36 may be 5 mm$^2$ to 1 m$^2$ or larger, depending on the application. The height of the box 36 may be adjusted to control the gap between the top of the LED dies 30 and the exit window. This gap 39 may be as small as 0.1 mm and can be chosen to achieve the desired light mixing. An exemplary guideline is to arrange the height of side 38 or the gap 39 in proportion to an LED die's largest dimension. One exemplary ratio for the height, or the gap 39 can range from 0.1 times the LED die's largest side dimension to 5 times the LED die's largest side dimension. The height or the gap 39 may also depend on the pitch of the LED dies 30. Optimal heights or gaps to achieve a target color uniformity can be determined by simulation or experimentation. There may be a single LED die in a light-mixing box or a plurality of LED dies 30 arranged in a linear, two-dimensional, or circular array.

Directly above the LED dies 30 is a support plate 40 which is transparent or translucent to the wavelength of light emitted by one or more of LEDs 30. The support plate 40 may support a layer of phosphor 42. The support plate 40 may comprise glass, or a ceramic material, such as translucent alumina or sapphire. The support plate 40 may be substantially flat or curved, such as convex, preferably with a constant thickness. In another embodiment, the phosphor 42 layer itself may have sufficient mechanical strength so as to be self-supporting without the support plate 40. In one example embodiment, the support plate 40 may be eliminated. In one embodiment, the phosphor 42 is suspended anywhere from 0.1 mm above the LED dies 30 to 1 cm above the LED dies 30, depending on the required color uniformity across the light exit window for the particular application, and other factors. The gap between the LED dies 30 and the plate 40 may contain air (or other gas) or be filled with a transparent material, such as silicone or another transparent material with good thermal conductivity.

In one embodiment, white is generated by using blue LEDs 30 and a phosphor 42 that emits yellow light when illuminated or "pumped" with blue light. Some blue light "leaks" through the phosphor layer 42 to combine with the yellow light and produce white light. In other embodiments, the phosphor 42 may contain red phosphors that emit red light when "pumped" by blue light. In yet other embodiments, the phosphor 42 may emit red and green light that combines with blue light from the LEDs 30.

In another embodiment, the phosphor 42 is on the bottom surface of the support plate 40, and the support plate 40 acts to protect the phosphor 42. In this configuration, the support plate 40 is transparent or translucent to the wavelength of light emitted by one or more of LEDs 30 and/or the light emitted from the phosphor 42.

Figure 1:
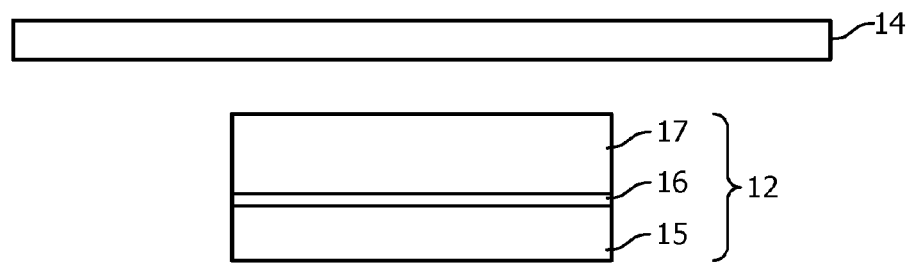
FIG. 1 is a cross-sectional view of a prior art LED die with a phosphor layer overlying the LED die.
Figure 2:
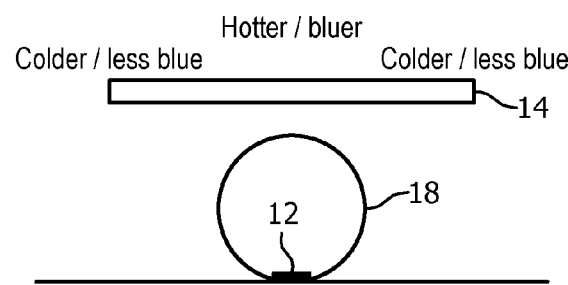
FIG. 2 illustrates the generally Lambertian emission pattern of the LED die of FIG. 1 and the resulting phosphor-converted emission across the surface of the phosphor, with different color temperatures indicated.

As shown by the angular intensity distribution profile 44 (in polar coordinates) for each LED die 30, each LED die 30 includes an optical structure (shown in other figures) that reduces the LED die's emission (flux) in the direction of the LED die's normal axis and enhances the off-normal axis emission. Without the optical structure, the intensity distribution profile for each LED 30A-30C would resemble that of FIG. 2. The intensity distribution profile is selected for a particular application so that the light from the LED dies 30 impinging on the phosphor 42 results in approximately uniform illuminance across a wide area of the phosphor 42. The combination of light from adjacent LED dies 30 and the light reflected from the surfaces of the light-mixing box 36 makes the combined light impinging on the phosphor 42 substantially uniform across the entire surface of the phosphor 42.

Accordingly, by using the design of FIG. 3, the light exiting the phosphor 42 will be substantially uniform in color and brightness across the phosphor 42, and the temperature across the phosphor 42 will be substantially uniform. Additionally, the mixing of the light in the light-mixing box 36 further improves the color, brightness, and temperature uniformity.

In contrast, without the optical structures on the LED dies 30, the light exiting the top surface of the phosphor 42 would be bluer (assuming a blue LED and YAG phosphor) along the normal axis of each LED die 30, and the temperature of the phosphor 42 along the normal axis of each LED die 30 would be hotter than in other areas. These localized hotter areas are referred to as hotspots.

It is also possible to increase the uniformity of illuminance distribution over the exit window of the light-mixing box with regular LED dies (having Lambertian emission patterns) by increasing the height of the light-mixing box to increase the amount of light mixing. The disadvantage of that approach is that the light-mixing box will become too bulky and the multiple reflections will reduce light output. By using the present invention, the light-mixing box 36 can be made shallower without any reduction in color uniformity. In a simulation, Applicants determined that, by using the present invention, the color uniformity for a 3 mm high circular light-mixing box emission containing 16 LED dies was equal to the color uniformity achieved by a 5 mm high light-mixing box using prior art techniques.

Figure 5:
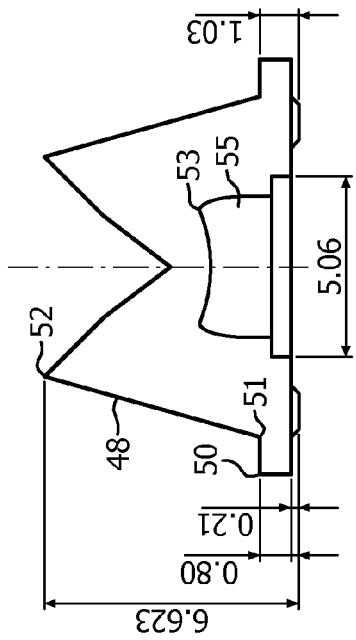
FIG. 5 is a cross-sectional view of the lens of FIG. 4 with typical dimensions indicated.
Figure 6:
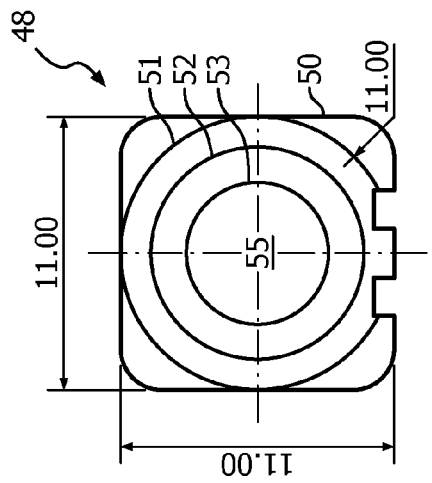
FIG. 6 is a top down view of the lens of FIG. 4 with typical dimensions indicated.
Figure 4:
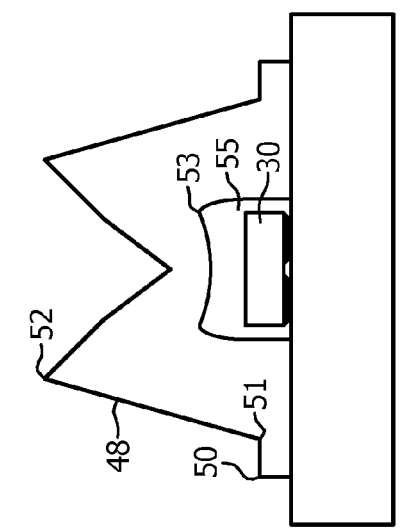
FIG. 4 is a cross-sectional view of a lens, mounted over an LED die, which reduces the flux along the normal axis and enhances the flux at an angle.

FIG. 4 illustrates one type of molded lens 48 that can create a suitable intensity distribution profile, such as the intensity distribution profile 44 in FIG. 3. FIG. 5 identifies some exemplary dimensions of the lens 48 in millimeters. Scalable versions of these dimensions with respect to the dimensions of the LED die will produce similar results. FIG. 6 is a top down view of the lens 48, showing the various edges 50, 51, 52, and 53 of the lens 48 and various exemplary dimensions in millimeters. Edge 50 is a rounded outer edge. Edge 51 is a circular edge of the base of the lens. Edge 52 is a circular upper edge of the lens. And edge 53 is an edge of the inner cavity 55 of the lens. The lens 48 may be made by silicon molding. The lens 48 is affixed over the LED die 30. The bottom surface of the lens 48 may be affixed to the reflective base 34 of the light box 36 or affixed to a submount surface on which the LED die 30 is mounted.

Figure 7:
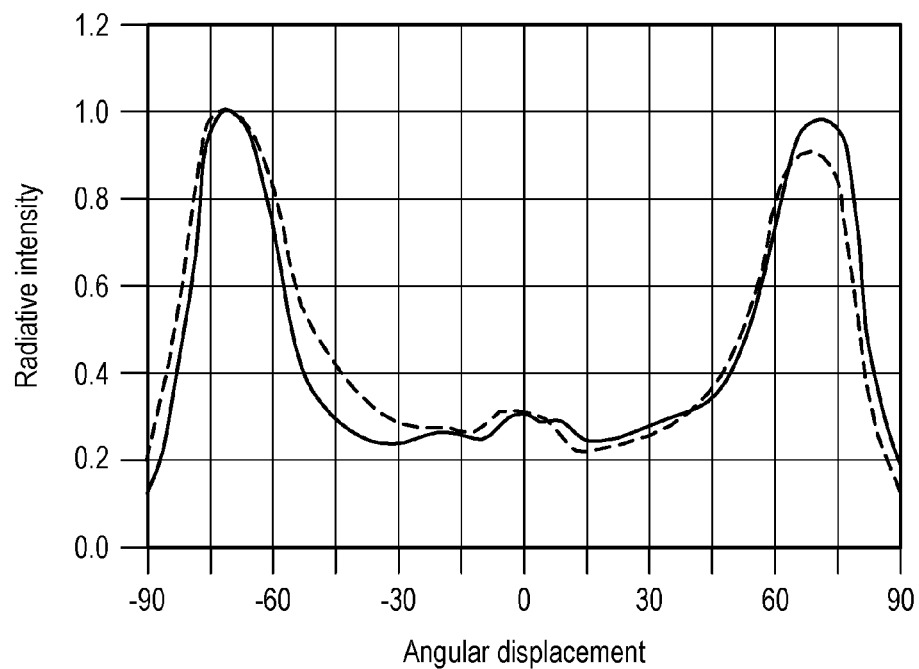
FIG. 7 illustrates the angular intensity distribution profile (radiation profile) of light exiting the structure of FIG. 4, with emission peaks around 70 degrees from the normal axis of the LED die.

The differences in refractive indices at the various interfaces of the lens 48 cause refraction of the light. FIG. 7 illustrates the intensity distribution profile of light exiting two samples of the structure of FIG. 4, with emission peaks around 70 degrees from normal. The optimal angle of peak intensity depends on the LED die pitch and the distance of the phosphor 42 from the tops of the lenses 48. The optimal angle may be determined by simulation or experimentation.

In some applications, using the lens 48 (having a height that may exceed 6 mm, depending on the size of the LED die) may require a light-mixing box that is too deep or too large. Some other optical techniques that enable the use of a shallower light-mixing box are described below.

Figures 8, 9:
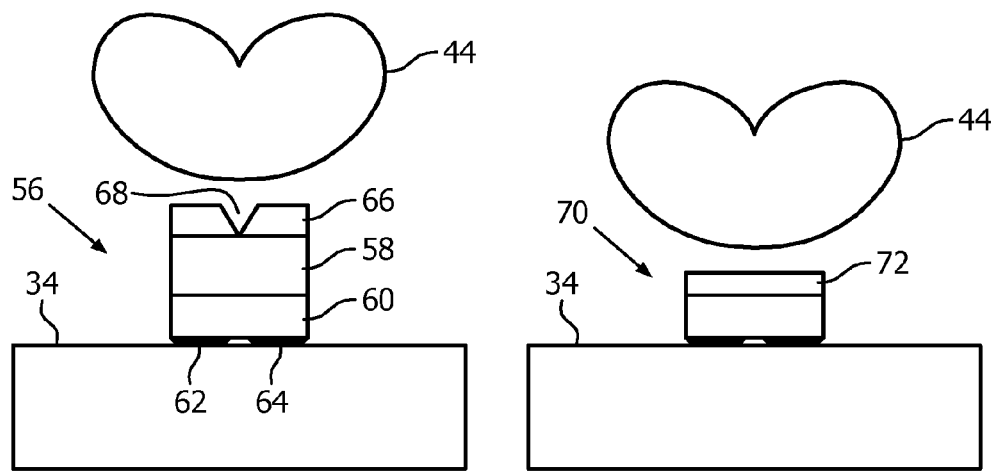
FIG. 8 is a cross-sectional view of an LED die with a top refractive layer having a central conical indentation that reduces the die's flux along the normal axis and enhances the flux at an angle.
FIG. 9 is a cross-sectional view of an LED die with a top semi-reflective layer that reduces the die's flux along the normal axis and enhances the flux at an angle.

FIG. 8 illustrates another type of optical structure that creates the desired intensity distribution profile from the LED semiconductor layers 60. In FIG. 8, the LED die 56 is a flip chip. The transparent growth substrate 58 (e.g., sapphire) is left on the LED semiconductor layers 60, and the anode and cathode electrodes 62 and 64 are bonded to corresponding metal pads on the submount or reflective base 34. A transparent layer 66 is provided on the top surface of the substrate 58 that has a cone shaped indentation 68 that reduces the light emitted along the normal axis and enhances the light emitted at an angle, as shown by the intensity distribution profile 44. The layer 66 may be molded silicone or other material. The layer 66 may be affixed to the top of the substrate 58 by a silicone adhesive or molded directly over the substrate 58. Alternatively, the indentation 68 may be incorporated directly into the substrate 58, such that the additional layer 66 is not required.

In another embodiment, the substrate 58 is substituted by a glass layer or other transparent layer affixed to the LED semiconductor layers 60. The substrate 58 or glass layer should have a thickness preferably of the order of the length of the largest linear dimension of the LED semiconductor layers 60 to minimize reflections back into the LED semiconductor layers 60.

FIG. 9 illustrates an LED die 70 having a semi-reflective layer 72 formed on the top surface of the LED die 70. The layer 72 may be affixed to a substrate layer over the LED semiconductor layers. The layer 72 may be formed of an opaque reflective material deposited in a pattern of small dots, or a checkered pattern, where there is a higher density of the reflective dots in the center area for reflecting more light back into the LED die 70 in the center area. The light that is reflected back into the LED die 70 is eventually re-cycled and reflected out of the LED die 70 in the other directions. The resulting intensity distribution profile 44 is shown. The layer 72 may also be a dichroic filter layer or Bragg reflector formed of many thin dielectric layers, where there is greater reflection for light emitted perpendicular to the LED die surface than for angled light. This will result in the intensity distribution profile 44.

In another embodiment, the layer 72 may be a diffusive layer such as a volume scattering layer that scatters part of the incident light backwards and sidewards to reduce the amount the light emitted from the top surface and increase the amount of light emitted from the side surfaces of the structure.

In FIGS. 8 and 9, the optical structure at the top of the LED die may extend over the edges of the LED semiconductor layers to further reduce the amount of light along the normal axis.

In an alternative embodiment, a preferred intensity distribution profile 44 has a peak intensity between approximately 25-45 degrees from the normal axis, where the optimal angle of peak intensity depends on the pitch of the LED dies and the distance of the phosphor from the top surface of the LED dies. Such angles of peak intensity may be appropriate for shallow light-mixing boxes 36, such as between 2-5 mm in height above the top of the LED dies.

Figure 10:
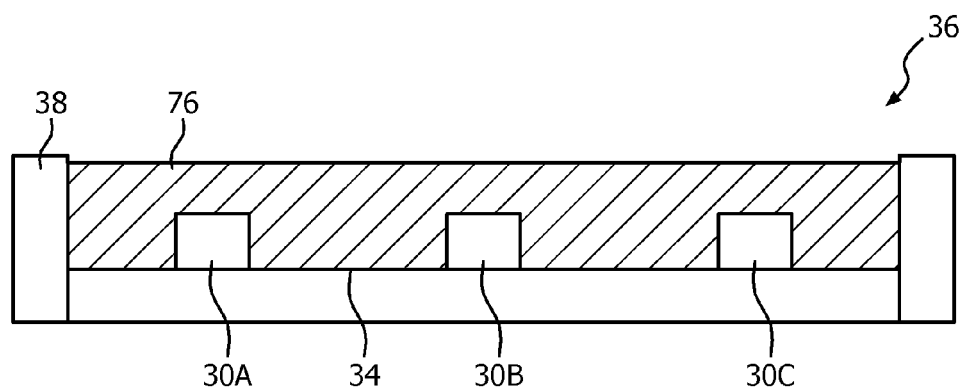
FIG. 10 is similar to FIG. 3 but the phosphor encapsulates the LED dies in the light-mixing box.

FIG. 10 illustrates the LED dies 30A, 30B, and 30C of FIG. 3 in the light box 36, having any of the optical structures described herein (producing the intensity distribution profile 44), but the phosphor 76 (shown as hatched) encapsulates one or more of the LED dies 30. The phosphor 76 may fill the light-mixing box 36 up to any level, depending on the desired emission color, phosphor particle density in a transparent binder, and other factors. If the silicone lens 48 of FIG. 4 is used, preferably the index of the phosphor binder material (typically about 1.4) is lower than the index of the silicone lens (typically 1.53) to enable the lens to refract the light in the preferred direction. Several of the LED dies may be a red LED emitter to emit a narrow portion of the red light spectrum through the phosphor layer, whereas the other LED dies may be blue or UV-emitting to excite the phosphor layer. In another alternative, as described above, the phosphor may emit red light when illuminated by blue light.

The LED dies 30 include any of the optical structures described herein. The light emission out of the light-mixing box 36 will be substantially uniform across the light exit area of the light-mixing box 36.

In another embodiment, the light from one or more of the LED dies 30A, 30B, and 30C mounted in the light-mixing box 36 is not phosphor-converted and has a generally Lambertian emission. For example, the LED die 30A may be a conventional red-emitting LED die having a generally Lambertian emission, the LED die 30B may be a blue-emitting die with a green phosphor overlying it, and the LED 30C may be a conventional blue-emitting die with no phosphor overlying it. The combination of the red, green, and blue light create white light. The light-mixing box 36 mixes the light. The phosphor 76 filling the light-mixing box 36 may then be eliminated, and a diffuser may be located over the light exit window of the box 36.

In another embodiment, the LED die 30A may be a conventional red-emitting LED die having a generally Lambertian emission, the LED die 30B may be a blue-emitting die with a YAG phosphor overlying it, and the LED 30C may be another blue-emitting die with a YAG phosphor overlying it. The phosphor 76 may be eliminated. The red light creates a "warmer" white light with improved color rendering.

Figures 11, 12:
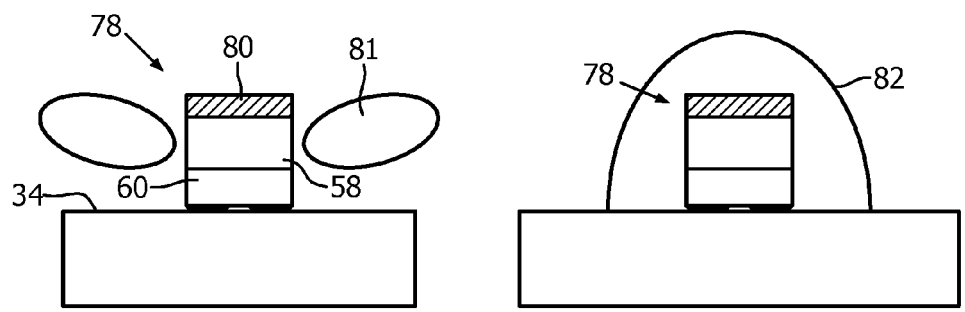
FIG. 11 is a cross-sectional view of an LED die with a top reflective layer that increases side emission.
FIG. 12 illustrates the LED die of FIG. 11 encapsulated with a transparent dome for increased light extraction.

FIG. 11 illustrates an LED die 78 including LED semiconductor layers 60, a transparent growth substrate 58, and a reflector layer 80, such as a silver layer. The reflector layer 80 reflects or partially reflects the light emitted by semiconductor layers 60. By making the substrate 58 thicker, it is possible to vary the range of angles of the sideward emission so that the intensity distribution profile 81 approaches that of the intensity distribution profile 44 in FIG. 3. The distribution profile 81 is generally upward and to the sides since the bottom LED electrodes and base 34 reflect some of the light. The thickness of the substrate 58 (or other transparent layer) may be between 0.1 to 2 mm or greater to achieve the desired intensity distribution profile. In one embodiment, the substrate 58 top surface is patterned using an etchant (or other roughening technique) to further diffuse the light to increase the range of the emission angles. If the reflector layer 80 is made thin enough, some portion of the light will pass through the reflector layer 80 to closer approach the intensity distribution profile 44.

In another embodiment, the reflective layer 80 may be a diffusive layer such as a volume scattering layer that scatters part of the incident light backwards and sideways to reduce the amount the light emitted from the top surface and increase the amount of light emitted from the side surfaces of the substrate 58.

FIG. 12 illustrates the LED structure of FIG. 11 encapsulated in a transparent dome 82 for increased light extraction. A plurality of the LED structures of FIG. 12 may be mounted in the light-mixing boxes 36 described herein with an overlying phosphor layer to achieve a more uniform color emission across the phosphor layer.

Figure 13C:
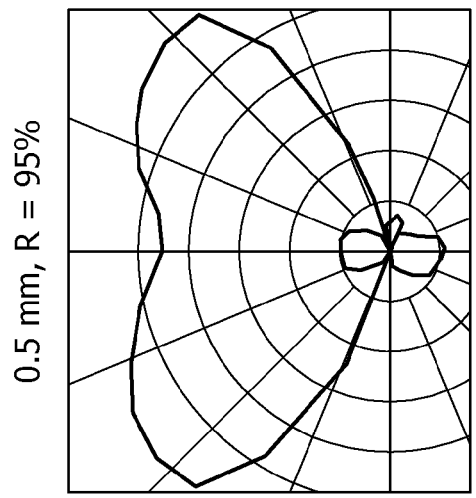
FIGS. 13A, 13B, and 13C are simulated intensity distribution profiles for the side-emitting LED of FIG. 11 for different thicknesses of the transparent substrate and different reflectivities of the reflector layer.
Figure 13B:
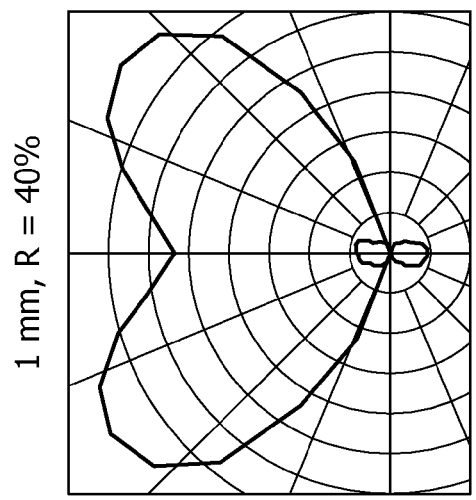
Figure 13A:
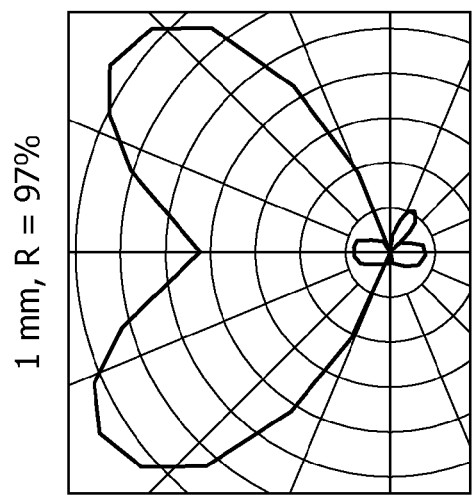

FIGS. 13A, 13B, and 13C are simulated intensity distributions for the side-emitting LED 78 of FIG. 11 for different thicknesses of the transparent substrate 58 and different reflectivities of the reflector layer 80. As seen, reducing the reflectance (FIG. 13B) and allowing more light to pass through the reflector layer 80 increases the intensity along the normal axis. Also, reducing the thickness of the substrate 58 (FIG. 13C) also increases the relative intensity along the normal axis.

Figure 14:
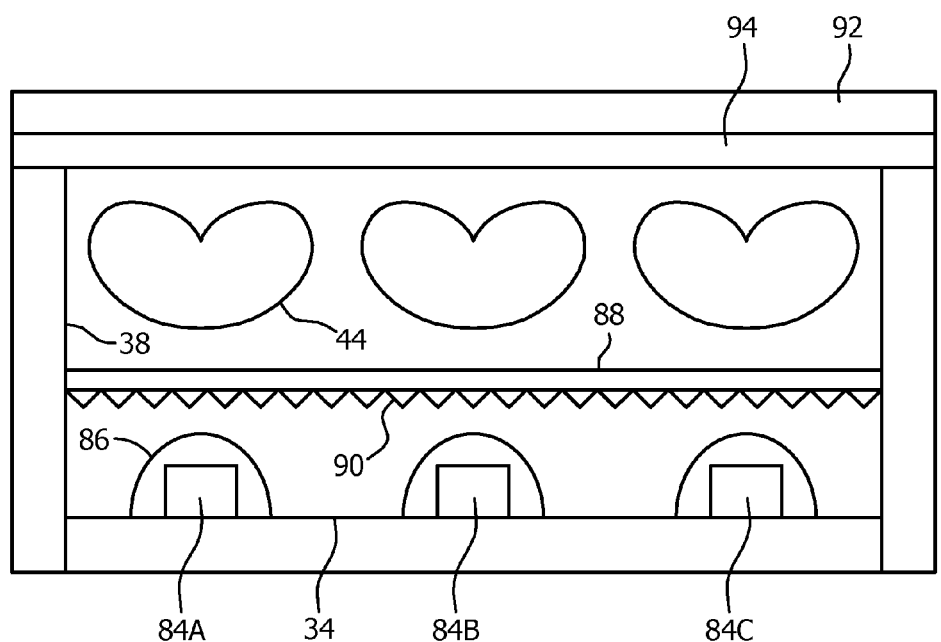
FIG. 14 is a cross-sectional view of a light-mixing box containing LED dies, where an optical sheet, placed between the LED dies and the phosphor layer, has features which reduce the dies' flux along the normal axis and enhance the flux at an angle.

FIG. 14 illustrates conventional LED dies 84A, 84B, and 84C, each encapsulated in a dome 86 to improve light extraction, where the optical structure for creating the desired intensity distribution profile 44 is a spaced optical sheet 88 having an optical structure 90 with a pattern that translates the normal Lambertian emission into the intensity distribution profile 44. The pattern may include prisms, pyramids, cones, Fresnel lenses, or V-grooves in one or more directions, either recessed in the sheet 88 or salient. The features in the pattern are typically facing downward to bend the light sideways. The LED dies' emission is additionally mixed by the reflective surfaces of the light-mixing box. A phosphor 92 supported on a transparent support plate 94 wavelength-converts a part of the mixed LED dies' emission into another spectral range. The result is a substantially uniform illuminance and color distribution across the top surface of the phosphor 92. There may also be a stack of optical layers used in place of the optical sheet 88, especially when groove structures are used. For instance, a first optical layer has grooves extending in a first direction, and the second optical layer has grooves extending in a second direction such as perpendicular to the first direction. There is preferably a low index material between both optical sheets, such as an air gap.

In the various embodiments, multiple phosphor layers may be used to achieve the desired color. For example, one phosphor may be coated over the LED dies, while a different phosphor may be spaced away from the LED dies. Or, in the case of FIG. 3, one phosphor may be formed on one side of the support plate 40 and another phosphor may be formed on the other side of the support plate 40. Different phosphors may also be formed as overlying layers.

If the LED dies are laser LED dies, their normal-axis directionality of emission is even greater than that of conventional LED dies. By providing optical structures such as surface gratings (for diffraction), Bragg gratings, holograms, and holographic diffusers over the laser's top surface to create the intensity distribution profile 44, the illumination of an overhead "vicinity" phosphor will be more uniform, and the above-described benefits equally apply.

All the phosphor layers shown herein may be replaced or augmented with a quantum dot layer, an organic or inorganic phosphor, or combinations for wavelength conversion.

As a result of using the optical structures in combination with the spaced wavelength conversion layer, not only is color and flux uniformity improved but higher quantum efficiency is achieved due to the reduction of the "hotspots" on the layer, resulting in lower local and overall temperature of the conversion layer. Further, there is less degradation of the conversion layer due to the reduced peak values of local flux density, which results in enhanced lumen output and lumen maintenance (stability and reliability).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   first light emitting diode (LED) semiconductor layers, the first LED semiconductor layers having a top light emitting surface, the first LED semiconductor layers generating light having a first peak wavelength;
   a first wavelength conversion layer overlying and spaced away from the top light emitting surface of the first LED semiconductor layers;
   a first optical structure between the first LED semiconductor layers and the wavelength conversion layer and spaced from the wavelength conversion layer by a first gap, the first optical structure reducing a light emission of the first LED semiconductor layers along a normal center axis with respect to the top light emitting surface and enhancing the light emission at an angle with respect to the normal center axis, producing a first light emission profile,
   wherein a peak intensity of light emitted from the first optical structure at an angle with respect to the center axis is greater than the peak intensity of light emitted from the first optical structure along the center axis,
   wherein the first optical structure is attached to the top light emitting surface and has dimensions limited to an area of the top light emitting surface,
   wherein light, having the first light emission profile, generated by the combination of the first LED semiconductor layers and the first optical structure, impinges on the first wavelength conversion layer, and wherein some of the light passes through the first wavelength conversion layer and some of the light is converted to light of a wavelength different from the first peak wavelength.

2. The light emitting device of claim 1 wherein the first optical structure comprises a semi-reflective layer formed over the first LED semiconductor layers.

3. The light emitting device of claim 2 wherein the semi-reflective layer is a patterned reflective layer.

4. The light emitting device of claim 1 wherein the first optical structure comprises a transparent layer formed over the first LED semiconductor layers, wherein the transparent layer contains features that reflect and refract light from the first LED semiconductor layers to create the first light emission profile.

5. The light emitting device of claim 4 wherein the transparent layer has a conical indentation over a center portion of the LED semiconductor layers.

6. The light emitting device of claim 1 wherein the first optical structure comprises an optical layer, having an optical structure with a pattern, separated from the first LED semiconductor layers by a second gap.

7. The light emitting device of claim 1 further comprising a solid transparent layer between the first LED semiconductor layers and the first optical structure.

8. The light emitting device of claim 1 further comprising a reflective light-mixing chamber containing the first LED semiconductor layers, first optical structure, and first wavelength conversion layer, wherein the light-mixing chamber comprises a reflective base and at least one reflective side wall.

9. The light emitting device of claim 1 wherein the first wavelength conversion layer is a substantially flat layer.

10. The light emitting device of claim 1 wherein the first wavelength conversion layer comprises a phosphor layer.

11. The light emitting device of claim 1 further comprising:
at least second LED semiconductor layers;
a second optical structure overlying the second LED semiconductor layers; and
a reflective light-mixing chamber containing the first LED semiconductor layers, first optical structure, first wavelength conversion layer, second LED semiconductor layers, and second optical structure, wherein the light-mixing chamber comprises a reflective base and at least one reflective side wall,
for mixing the light from the first LED semiconductor layers and the second LED semiconductor layers, wherein the second optical structure improves uniformity of light impinging across the first wavelength conversion layer.

12. The light emitting device of claim 11 wherein the first wavelength conversion layer overlies both the first LED semiconductor layers and the second LED semiconductor layers.

13. The light emitting device of claim 11 wherein the second LED semiconductor layers generate light having a second peak wavelength different from the first peak wavelength.

14. The light emitting device of claim 11 wherein the first optical structure and the second optical structure are portions of a single sheet.

15. The light emitting device of claim 11 wherein the second optical structure is substantially identical to the first optical structure so that the second LED semiconductor layers in combination with the second optical structure produces a second light emission profile substantially identical to the first light emission profile, wherein the light having the first light emission profile and the light having the second light emission profile are mixed in the chamber.

* * * * *